(12) United States Patent
Feldbaum et al.

(10) Patent No.: US 9,330,885 B2
(45) Date of Patent: May 3, 2016

(54) METHOD OF STACK PATTERNING USING A ION ETCHING

(75) Inventors: Michael R. Feldbaum, San Jose, CA (US); Justin Jia-Jen Hwu, Fremont, CA (US); David S. Kuo, Palo Alto, CA (US); Gennady Gauzner, San Jose, CA (US); Li-Ping Wang, Fremont, CA (US)

(73) Assignee: Seagate Technology LLC, Cupertino, CA (US)

( * ) Notice: Subject to any disclaimer, the term of this patent is extended or adjusted under 35 U.S.C. 154(b) by 364 days.

(21) Appl. No.: 13/174,132

(22) Filed: Jun. 30, 2011

(65) Prior Publication Data

US 2013/0001195 A1    Jan. 3, 2013

(51) Int. Cl.
| | | |
|---|---|---|
| B44C 1/22 | (2006.01) | |
| C23F 1/00 | (2006.01) | |
| C03C 15/00 | (2006.01) | |
| C03C 25/68 | (2006.01) | |
| H01L 21/302 | (2006.01) | |
| H01L 21/461 | (2006.01) | |
| H01J 37/30 | (2006.01) | |
| H01J 37/305 | (2006.01) | |

(52) U.S. Cl.
CPC .............. *H01J 37/30* (2013.01); *H01J 37/3053* (2013.01); *H01J 37/3056* (2013.01); *H01J 2237/2007* (2013.01); *H01J 2237/31749* (2013.01)

(58) Field of Classification Search
CPC ..... H01J 37/305; H01J 37/3053; H01J 37/31; H01J 27/02; F03H 1/00
USPC .................. 216/66, 67, 94; 438/712
See application file for complete search history.

(56) References Cited

U.S. PATENT DOCUMENTS

| | | | |
|---|---|---|---|
| 8,232,532 B2 * | 7/2012 | Albrecht et al. ........... | 250/396 R |
| 2003/0102086 A1 * | 6/2003 | Garcia et al. ............. | 156/345.39 |
| 2004/0222082 A1 * | 11/2004 | Gopalraja et al. .......... | 204/192.3 |
| 2008/0078750 A1 * | 4/2008 | Boguslavsky et al. ... | 219/121.41 |
| 2008/0117509 A1 * | 5/2008 | Hayashi et al. ............... | 359/486 |
| 2008/0202920 A1 | 8/2008 | Iwaya et al. ............. | 204/192.34 |
| 2010/0028529 A1 * | 2/2010 | Yamanaka et al. ............ | 427/127 |
| 2010/0096568 A1 * | 4/2010 | Abarra et al. ............... | 250/492.3 |
| 2010/0320393 A1 | 12/2010 | Albrecht et al. ............. | 250/398 |
| 2012/0164486 A1 * | 6/2012 | Bonhote et al. ............... | 428/812 |

FOREIGN PATENT DOCUMENTS

| | | |
|---|---|---|
| JP | 2007-251038 A | 9/2007 |
| KR | 10-2011-0052565 | 5/2011 |

OTHER PUBLICATIONS

ISR and WO for related International Patent Application No. PCT/US2012/044986, mailed on Jan. 10, 2013.

* cited by examiner

*Primary Examiner* — Binh X Tran
*Assistant Examiner* — Thomas Pham

(57) ABSTRACT

The embodiments disclose a method of stack patterning, including loading a stack into a stationary stack stage, rotating one or more ion beam grid assemblies substantially concentrically aligned with the stationary stack stage to etch the stack and controlling the operation of the one or more ion beam grid assemblies to achieve substantial axial uniformity of the etched stack.

21 Claims, 7 Drawing Sheets

METHOD OF STACK PATTERNING USING A ION ETCHING

BACKGROUND

Ion beam etching systems in production are using rotation of wafer or media or disk for getting good uniformity. Rotating of the disk while holding them between two beam sources, to mill from both sides simultaneously, uses expensive mechanical solutions. The mechanical solutions create a lot of tearing and wearing parts which produce particles in close vicinity of the processed wafer or media or disk and materials being applied which may contaminate the surfaces. Loading-un-loading of processed material in process module with rotating holder (carrier) will require the separation of the carrier, it further complicates the tool design and promote the media surface scratching and particles generation as a result.

DETAILED DESCRIPTION OF THE INVENTION

In a following description, reference is made to the accompanying drawings, which form a part hereof, and in which is shown by way of illustration a specific example in which the invention may be practiced. It is to be understood that other embodiments may be utilized and structural changes may be made without departing from the scope of the present invention.

General Overview:

It should be noted that the descriptions that follow, for example, in terms of a method of stack patterning using rotating ion beam grids is described for illustrative purposes and the underlying system can apply to any number and multiple types of ion beam and ion beam etching tools. In one embodiment of the present invention, the rotating grid can be configured to be used for etching. In one embodiment grids can be configured to steer the beam possible by changing grid alignment. The rotating grid can be configured to include use of shapers, in combination with parallel or focusing grids, to improve radial uniformity, using the present invention.

Figure 1:
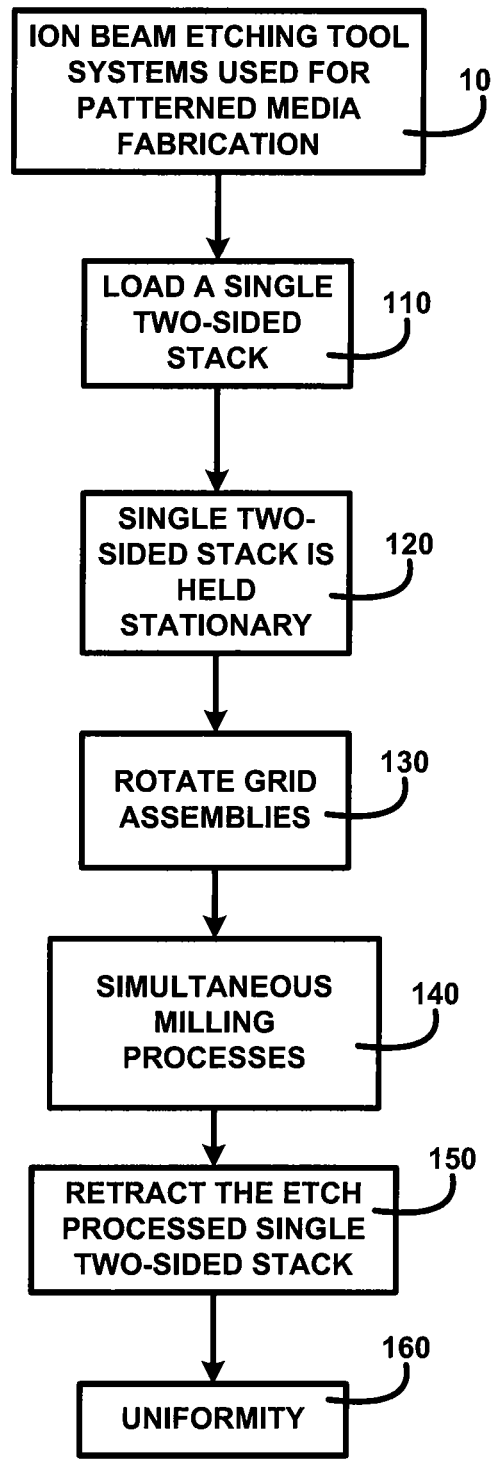
FIG. 1 shows a block diagram of an overview of a method of stack patterning using rotating ion beam grids of one embodiment.

FIG. 1 shows a block diagram of an overview of a method of stack patterning using rotating ion beam grids of one embodiment. Ion beam etching tools are used in processes that use ions directed into beams toward materials to be milled for removal of material from places, not covered (protected) by a mask, by sputter-etching. Energy of ionized species and their trajectories are defined by grid potentials.

Grid assemblies are structures comprising multiple conduits or tubes to select and direct ions in motion. The ion beam etching tools may be configured to use multiple grids in an assembly. The patterning of a stack may be configured to use multiple rotating grid assemblies to simultaneously etch two or more sides of a stack. The grid assemblies may use electrical voltages to change the charge of the ions and accelerate their motion in a predetermined path with minimal divergence. The process of directing the ions is collimation and may be configured to direct the ion beams in parallel or angled to the concentric axis of rotation of the grid assemblies. Grid assembly structures may be created to angle ion beam direction or focus ion beams to precise predetermined locations on a stack of one embodiment.

FIG. 1 shows ion beam etching tool systems used for patterned media fabrication 100 configured for use in the method of stack patterning using rotating ion beam grids. The ion beam etching tool systems used for patterned media fabrication 100 may include performing processes such as etching of films in patterned media fabrication. The method of stack patterning using rotating ion beam grids may include a step to load a single two-sided stack 110. The single two-sided stack is loaded into a device configured wherein a single two-sided stack is held stationary 120. The multiple rotating grid assemblies and loaded single two-sided stack are concentrically aligned.

The next step is to rotate grid assemblies 130. The rotating direction of the individual grid assembly may include independent rotating directions of multiple grid assemblies. For example the milling of a stack from one side may be configured to be independent of the milling process of the other side of the stack due to the independence of ionized species trajectories of one side from another and vise versa.

Mill depths of the processed stack are controlled to be as close as possible on a both sides. The mill depth may be controlled for each grid assembly independently. Adjustments of the electric potentials for each grid in each assembly can be done independently, resulting in independent mill depth regulation in one embodiment.

Ionized species are generated in a plasma source of the ion beam etching tool. The rotating multiple grid assemblies are used for collimation of the ionized species, generated by the plasma sources of each of the ion beam etching tool systems used for patterned media fabrication 100. Beam collimation adjusts the trajectories of ions extracting from a plasma source for example an Inductive Coupling Plasma (ICP) source in the ion beam etching tool. Ion trajectories are adjusted to achieve minimal divergence angle. The trajectories and energy adjustments for ionized species are achieved by precise alignment of orifices and right adjustment of electric potentials for each grid in both assemblies.

The rotating multiple grid assemblies may include grids that are parallel or oriented to direct or focus the ion beams to identical predetermined locations or regions of each side of the single two-sided stack. The rotating multiple grid assemblies allow simultaneous ion beam etch milling processes 140 to be performed. Upon completion of the simultaneous ion beam etch milling processes 140 the next step is to retract the ion beam etch processed single two-sided stack 150. The ion beam etch processed single two-sided stack is prevented from being contaminated by potential chaff from a rotating stage and has improved axial uniformity 160 through the concentric alignment of stack holding device and the multiple rotating grid assemblies with independent control systems.

DETAILED DESCRIPTION

Figure 2:
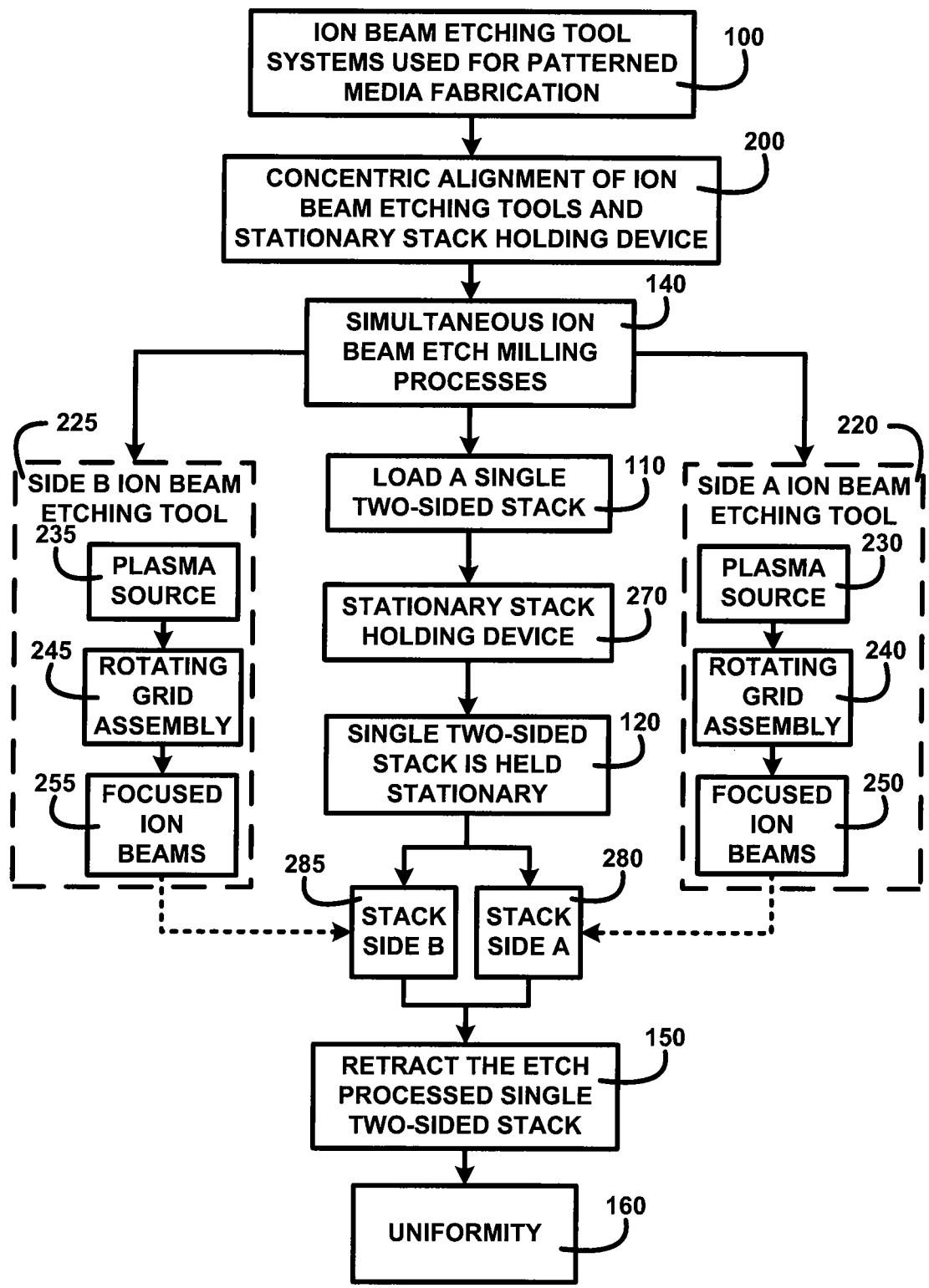
FIG. 2 shows a block diagram of an overview flow chart of a method of stack patterning using rotating ion beam grids of one embodiment.

FIG. 2 shows a block diagram of an overview flow chart of a method of stack patterning using rotating ion beam grids of one embodiment. FIG. 2 shows the ion beam etching tool systems used for patterned media fabrication 100. Ion beam etching uses an energetic, collimated and highly directional ion source for sputter-etch material from a stack. Improvement of uniformity 160 may be achieved using the concentric alignment of ion beam etching tools and stationary stack holding device 200. The simultaneous two-sided stack ion beam etch processes 140 using concentric alignment of ion beam etching tools and stationary stack holding device 200 and the independent controls of each of the grid assemblies improves uniformity 160 of one embodiment.

A two-sided stack has a first side (side A) and a second side (side B) that may be milled of materials made upon the substrate or previously deposited layers. Milling processes performed using an ion beam etching tool use ion beams. A plasma source such as an Inductive Coupling Plasma (ICP) source generates ions using one or more chemical element or compound. The generated ions are directed through the grid assemblies in a beam collimation process to alter the ion trajectories. The grid assembly structure may use electrical potentials applied to the grids structure. Precise alignment of orifices allows achieving minimal divergence angle of the ions of one embodiment.

The ion beam etching tool systems include a side A ion beam etching tool 220 that may include a plasma source 230 and a rotating grid assembly 240 used to create focused ion beams 250. The multiple ion beam etching tool systems also include a side B ion beam etching tool 225 that may include a plasma source 235 and a rotating grid assembly 245 used to create focused ion beams 255 of one embodiment.

A step in the method of stack patterning using rotating ion beam grids is to load a single two-sided stack 110 into a stationary stack holding device 270. The loaded single two-sided stack is held stationary 120 in a position concentric to the axis of rotation of the multiple ion beam etching tools. In the held stationary position stack side A 280 is facing the side A ion beam etching tool 220 rotating grid assembly 240. Stack side B 285 is facing the side B ion beam etching tool 225 rotating grid assembly 245 of one embodiment.

In for example an etching or milling process the side A ion beam etching tool 220 rotating grid assembly 240 is rotated. The focused ion beams from the side A rotating grid assembly 240 may make precise etches in the stack side A 280 while the loaded single two-sided stack is held stationary 120. The method of stack patterning using rotating ion beam grids allows simultaneous ion beam etch milling 140. In this example of an etching or milling process the side B ion beam etching tool 225 rotating grid assembly 245 is rotated simultaneously of one embodiment.

The focused ion beams from the side B rotating grid assembly 245 may make precise etches in the stack side B 285 while the loaded single two-sided stack is held stationary 120. The simultaneous ion beam etch milling processes may include independent rotating grid assembly adjustment controls to allow the independent etching in this example to achieve close penetration depths. The direction of the rotation of the two rotating grid assembly has no effect on the processes. The next step is to retract the ion beam etch processed single two-sided stack 150. The concentric alignment of the multiple ion beam etching tools and the single two-sided stack held stationary produces improved uniformity 160. The method of rotating grid assemblies for ion beam etching tools used for media fabrication allows improved uniformity 160 wherein <1% one sigma is achievable of one embodiment.

Figure 3:
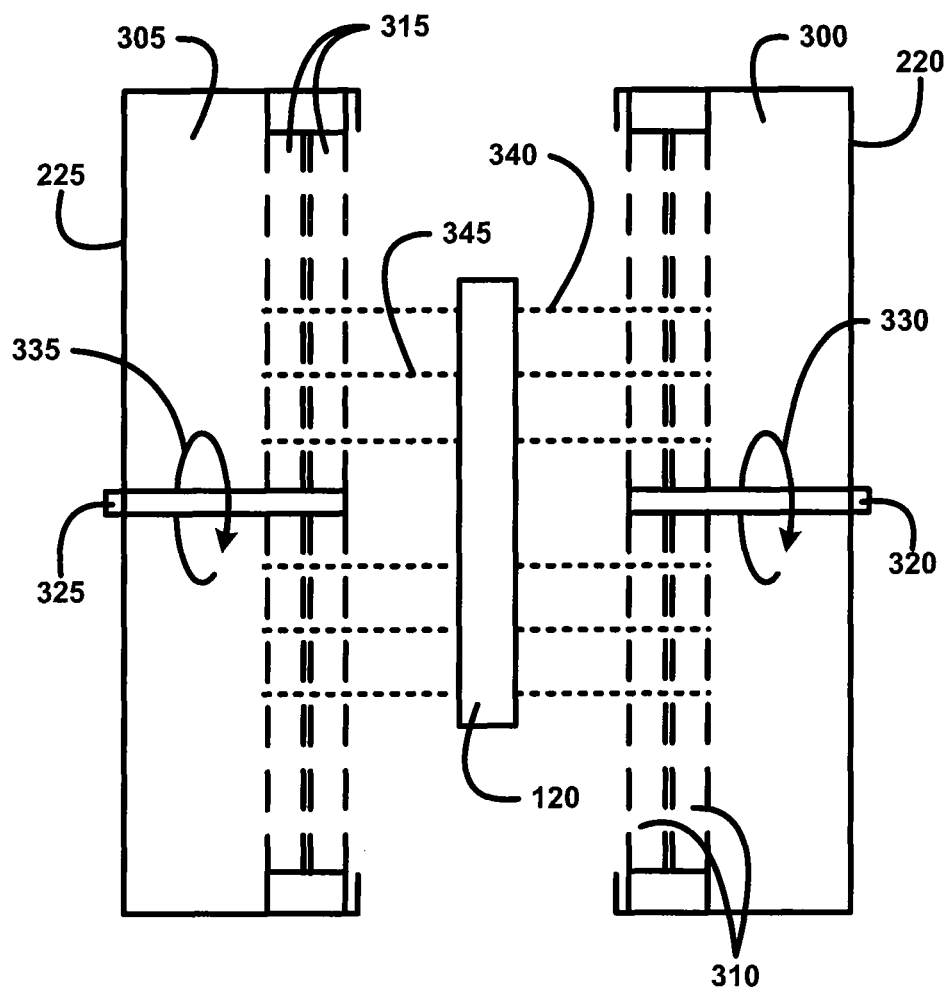
FIG. 3 shows for illustrative purposes only an example of a schematic of the major elements of the method of stack patterning using rotating ion beam grids of one embodiment.

Schematic of the Major Elements:

FIG. 3 shows for illustrative purposes only an example of a schematic of the major elements of the method of rotating grid assemblies for ion beam etching tools used for media fabrication of one embodiment. FIG. 3 shows the major elements of the multiple rotating grid assemblies and stationary held stack. The side A ion beam etching tool 220 includes a side A plasma source 300. The side A plasma source 300 generates ions being extracted from plasma source in a collimation process to create side A focused ion beams 340 using a side A rotating grid assembly 310. The side A rotating grid assembly 310 is a precisely constructed structure that includes conduits or tubes using electrical potential and precisely oriented orifices to direct the extracted ions into a beam with a minimal angle divergence. A side A grid assembly axle 320 may be rotated using a power source to create side A rotation 330 of the side A rotating grid assembly 310 of one embodiment.

The side B ion beam etching tool 225 uses ions generated by a side B plasma source 305 in an extraction and collimation process to focus ion beams. A side B rotating grid assembly 315 is a precise structure used to create side B focused ion beams 345 on the stack side B 285 of FIG. 2. Side B rotation 335 of the side B rotating grid assembly 315 is achieved by using a power source to rotate a side B grid assembly axle 325 of one embodiment.

The single two-sided stack is held stationary 120 between the side A ion beam etching tool 220 and the side B ion beam etching tool 225. The held single two-sided stack is in a concentric alignment with the axes of rotation of the multiple rotating grid assemblies. The side A rotating grid assembly 310 and the side B rotating grid assembly 315 may include two or more parallel electrically isolated disks (grids) with small holes passing through surfaces of the grids. Predetermined numbers and locations of the small through holes populate the surface areas of the grids. Each rotating grid assembly includes aligning the small through holes of the grids to create the paths for extracted ions.

The alignment concentricity allows the side A focused ion beams 340 and the side B focused ion beams 345 to for example precisely etch both sides of the held single two-sided stack. The concentric alignment and precisely constructed identical rotating grid assemblies structure produce increased axial uniformity 160 of FIG. 1 of one embodiment.

Figure 4A:
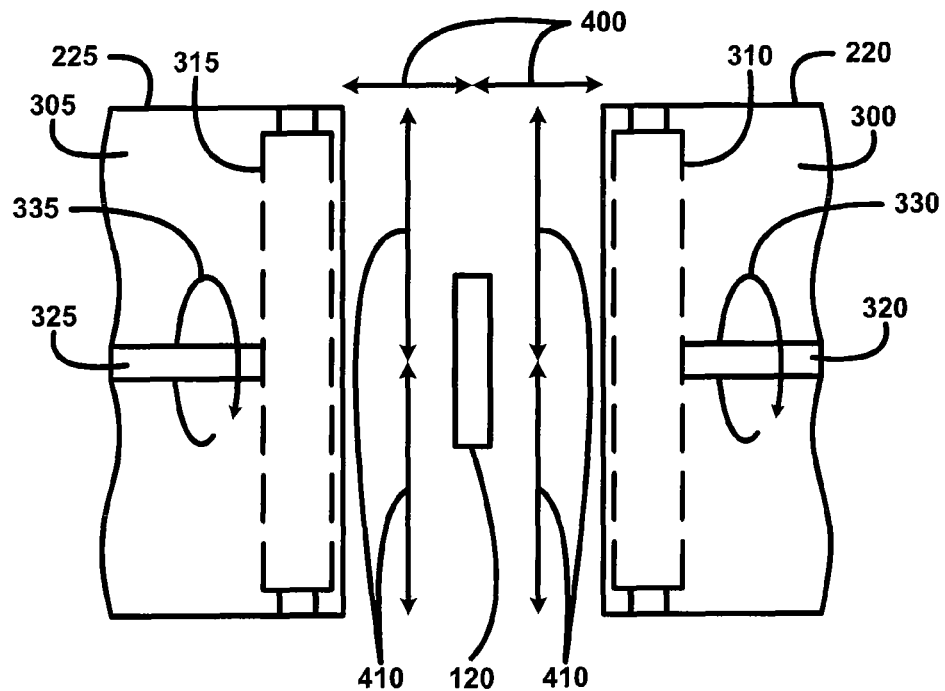
FIG. 4A shows for illustrative purposes only an example of stationary held stack of one embodiment.

Stationary Held Stack:

FIG. 4A shows for illustrative purposes only an example of stationary held stack of one embodiment. FIG. 4A shows the side A ion beam etching tool 220 comprising the side A plasma source 300, side A rotating grid assembly 310 and side A grid assembly axle 320. The side A rotation 330 is concentrically aligned with the side B rotation 335. The side B ion beam etching tool 225 includes the side B plasma source 305 and side B rotating grid assembly 315. The side B grid assembly axle 325 is used to create the side B rotation 335.

The single two-sided stack is held stationary 120 in the stack holding device which is concentrically aligned with the axes of rotation of the multiple grid assemblies. The stack holding device is positioned equal distance 400 between the side A rotating grid assembly 310 and the side B rotating grid assembly 315. The stack holding device is positioned a radial equal distance 410 from the axes of rotation of the side A rotating grid assembly 310 and the side B rotating grid assembly 315. The positioning of the stack holding device an equal distance 400 between the multiple rotating grid assemblies and concentric radial equal distance 410 from the axes of rotation creates equal trajectory distances for the side A focused ion beams 340 of FIG. 3 and the side B focused ion beams 345 of FIG. 3 to the single two-sided stack being held stationary. The independent rotating grid assembly adjustment controls may be used for example to make the final nanometer fine corrections to reach parity in the ion beam milling depths of the single two-sided stack being held stationary of one embodiment.

Figure 4B:
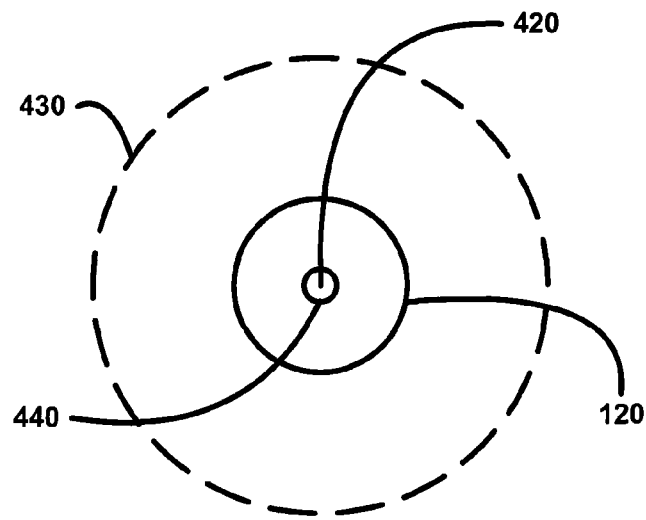
FIG. 4B shows for illustrative purposes only an example of multiple ion beam etching tools rotating grid assemblies and held stack concentric alignment of one embodiment.

Concentric Alignment:

FIG. 4B shows for illustrative purposes only an example of multiple ion beam etching tools rotating grid assemblies and held stack concentric alignment of one embodiment. FIG. 4B shows a stack held in concentric axial position 420 with each grid assembly axle 440. The single two-sided stack is held stationary 120 in a radial equal distance 410 of FIG. 4A from the axes of rotation placing the stack held in concentric axial position 420. The stack held in concentric axial position 420 is aligned concentrically with each rotating grid assembly 430 and each grid assembly axle 440. The concentricity of the held stationary stack with the concentric axial position of each rotating grid assembly provides the positioning during the ion beam processes to create axial uniformity of one embodiment.

Figure 5A:
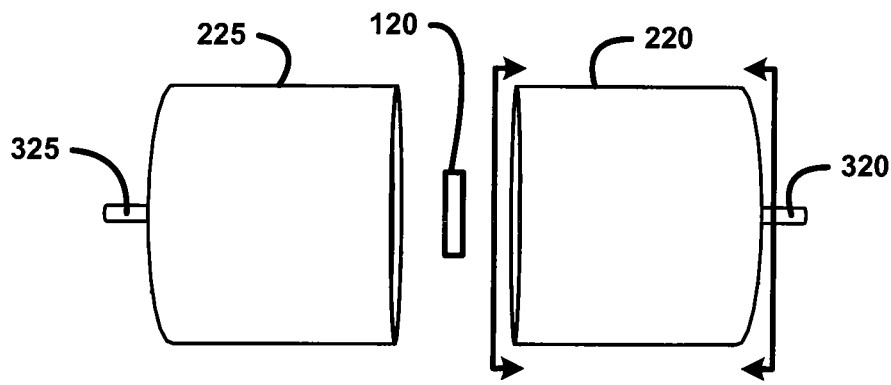
FIG. 5A shows for illustrative purposes only an example of an external view of the multiple rotating grids ion beam etching tool assembly of one embodiment.

Multiple Ion Beam Etching Tools:

FIG. 5A shows for illustrative purposes only an example of an external view of the multiple rotating grids ion beam etching tool assembly of one embodiment. FIG. 5A shows the single two-sided stack is held stationary 120 positioned equal distances between the multiple rotating grids ion beam etching tool assembly including the side A ion beam etching tool 220 and the side B ion beam etching tool 225. The side A grid assembly axle 320 may be connected to a rotational force to create and control rotation of the side A rotating grid assemblies such as a motor. A device such as a motor may be connected to the side B grid assembly axle 325 to control the rotation of the side B rotating grid assemblies. FIG. 5A shows the section plane lines on the side A ion beam etch module 220 used to show the interior illustrations of FIG. 5B and FIG. 5C that follow of one embodiment.

Figure 5B:
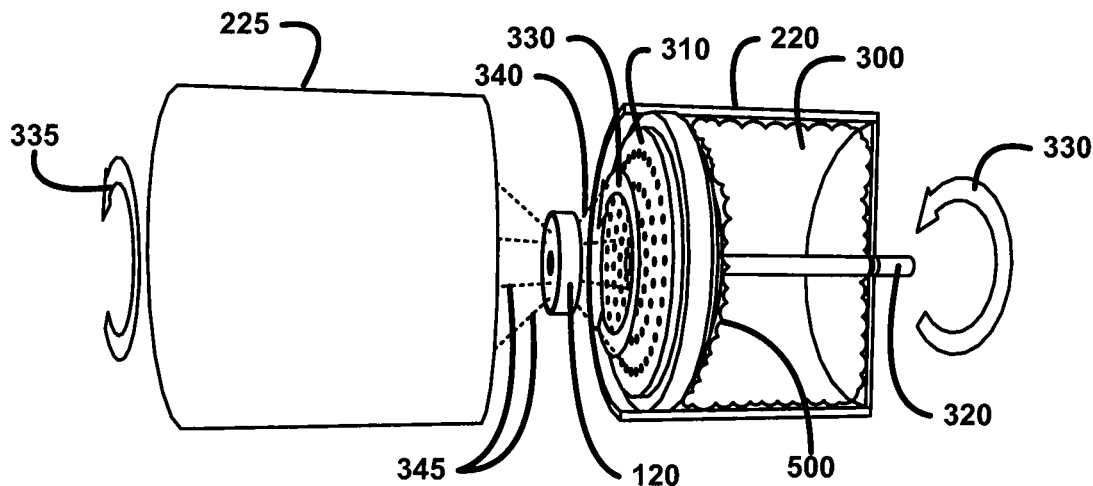
FIG. 5B shows for illustrative purposes only an example of an internal view of a rotating grid assembly stack focal rotation of one embodiment.

Ion Beam Etching Tool Focal Rotation:

FIG. 5B shows for illustrative purposes only an example of an internal view of a rotating grid assembly stack focal rotation of one embodiment. FIG. 5B shows the side B rotation 335 of the side B ion beam etching tool 225 grid assemblies used to create the side B focused ion beams 345. The side B focused ion beams 345 may be used to perform processes such as milling on the side B of the single two-sided stack while it is held stationary of one embodiment.

The FIG. 5B section view of the side A ion beam etching tool 220 shows the side A rotation 330 induced onto the side A grid assembly axle 320 using for example a motor. The side A ion beam etching tool 220 includes the side A plasma source 300 used to generate ionized species (plasma). The plasma may include the use of one or more elements or compounds as a source of the ions. The ions in the plasma are emitted through the collimators of the side A rotating grid assembly 310. The collimation emitted ions forms a beam focused on the side A of the single two-sided stack being held stationary. The side A focused ion beams 340 are used for example in a milling process to etch the substrate or film layers deposited onto side A of the single two-sided stack while it is held stationary of one embodiment.

The side A rotation 330 and side B rotation 335 may be in the same or opposite direction. The milling from one side of the single two-sided stack that is held stationary to the other side is unaffected by the direction of rotation of the grid assemblies. The mill depth for example on a focused ion beam processed stack is controlled to be as close as possible on a both sides of the single two-sided stack held stationary of one embodiment.

The etching in for example film layers of the processed stack performed in a simultaneous focused ion beam milling process of both sides of the stack includes independent controls of the milling process elements of both the side A ion beam etching tool 220 and side B ion beam etching tool 225. The side A ion beam etching tool 220 and side B ion beam etching tool 225 may include grid assemblies on both sides that are identical. The side A rotating grid assembly 310 and the side B rotating grid assembly 315 of FIG. 3 are configured identically to create for example mirrored milling results on both sides of the single two-sided stack held stationary of one embodiment.

Figure 5C:
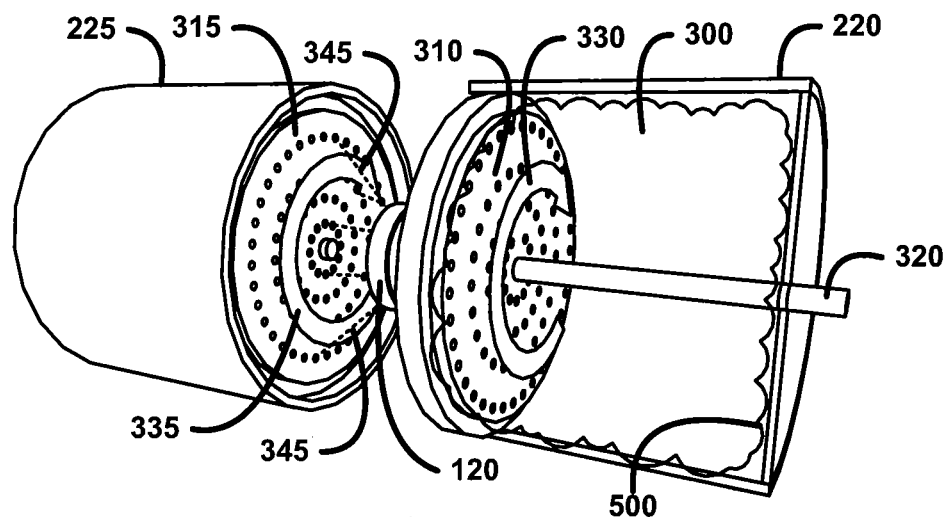
FIG. 5C shows for illustrative purposes only an example of an internal view of a rotating grid assembly plasma source of one embodiment.

Plasma Source:

FIG. 5C shows for illustrative purposes only an example of an internal view of a rotating grid assembly plasma source of one embodiment. The method of stack patterning using rotating ion beam grids may include an Inductive Coupling Plasma (ICP) source in both the side A ion beam etching tool 220 and the side B ion beam etching tool 225. Plasma is a gas where a portion of the molecules have been ionized. The ions remain in an uneasy equilibrium with the electrons they have released, prevented from recombining only because the electrons are hot and fast-moving, and so are difficult to trap.

FIG. 5C shows a side A plasma 500 created in the side A plasma source 300. The ions of the side A plasma 500 are emitted through grid assembly by extraction process in the side A rotating grid assembly 310 to create side A focused ion beams 340 of FIG. 3. The ions of a side B plasma generated in the side B plasma source 305 of FIG. 3 are emitted in the side B through rotating grid assembly 315 to create the side B focused ion beams 345. The focused ion beams are used in processes such as milling on the single two-sided stack held stationary.

Processes such as milling are unaffected by the side A grid assembly axle 320 created side A rotation 330 and the side B rotation 335. The emitting of ions through the side A rotating grid assembly 310 and the side B rotating grid assembly 315 are controlled independently. The independently controlled focused ion beam simultaneous side A and side B processes performed using the side A rotating grid assembly 310 and the side B rotating grid assembly 315 produces axial uniformity and uniformity in for example milling depths on both sides of the stationary held single two-sided stack of one embodiment.

Figure 6:
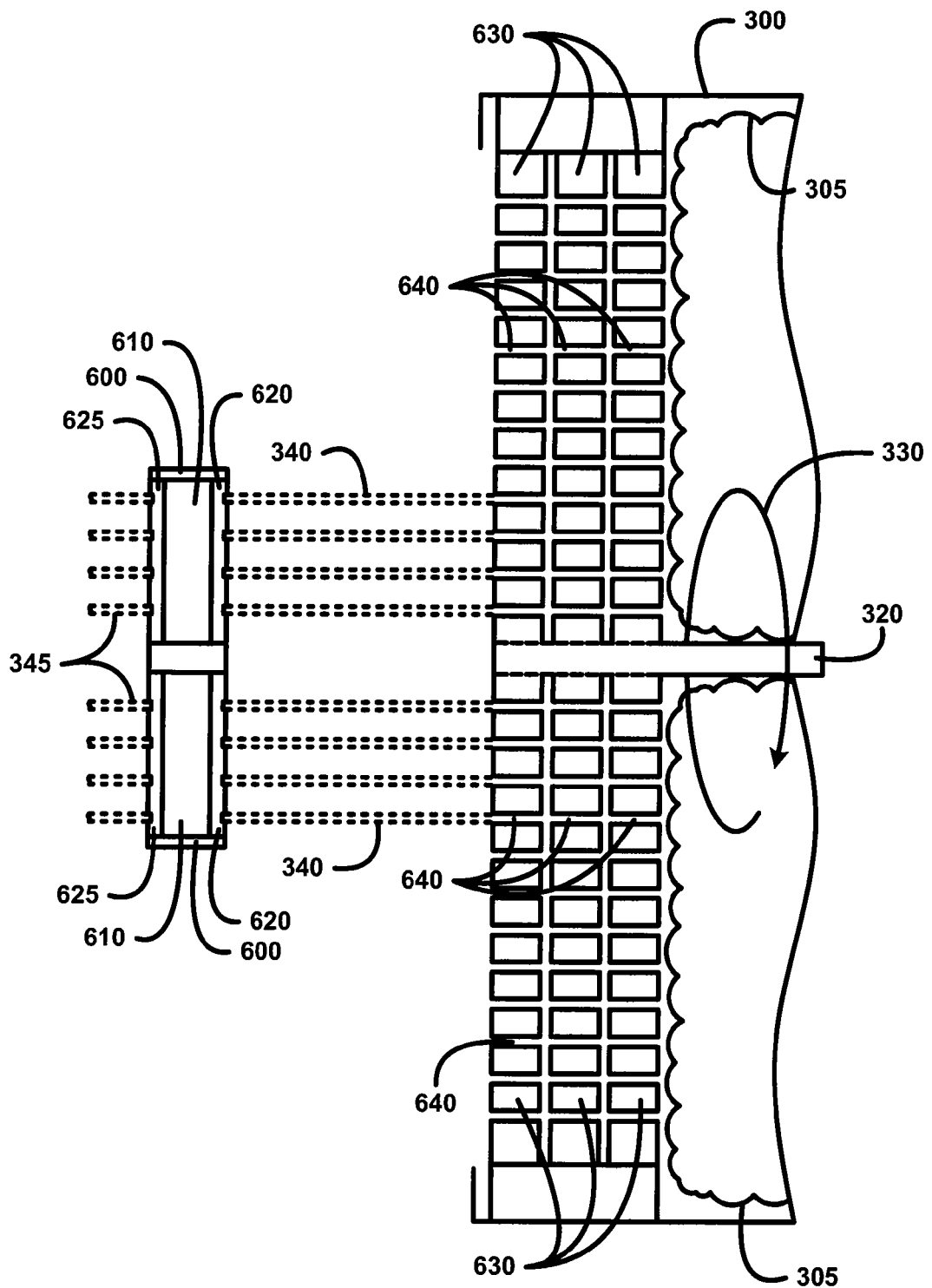
FIG. 6 shows for illustrative purposes only an example of multiple rotating grid assemblies milling process of one embodiment.

Focused Ion Beams:

FIG. 6 shows for illustrative purposes only an example of multiple rotating grid assemblies focused ion beams of one embodiment. FIG. 6 shows an example of focused ion beam 340 trajectories produced using ion beam 340 collimation. Trajectories of ions extracting from for example the side A plasma source 300 included in each of the rotating grid assemblies ion beam etching tools are adjusted to achieve minimal divergence angle.

Grid assembly may include for example three parallel electrically isolated disks (grids) 630 with small holes 640 through the grid and positioned all over the grid disks surface. The assemblage of each rotating grid assembly includes aligning the small holes 640 of the grids to create the paths for extracted ions. The minimal divergence angle of the beam collimation is achieved by the precise alignment of the small holes 640 orifices in the grid assembly. In one embodiment a process may include the adjustment of the electrical potentials of the isolated disks (grids) 630.

Adjustment of the electrical potentials is used for example to collimate the trajectories of the ions and accelerate the movement of the ions. The precision of collimation and degree of acceleration are very well controlled by using adjustable potential controls of each grid in the assembly. Beam energy is affecting, for example, mill depth of processed stacks, and may be adjusted on a both sides independently, to achieve symmetrical results on both sides of a stack. Grid assemblies on both sides are identical of one embodiment.

The side A plasma source 300 generates ion plasma 305 for use in the side A rotating grid assembly 310. The side A grid assembly axle 320 is rotated using a rotational motive force to create the side A rotation 330. In a milling process for example the trajectories of the side A focused ion beams 340 are directed to a predetermined axial location on a single two-sided stack substrate 610 being held in a stationary stack holding device 600. The milling process using the rotating side A focused ion beams 340 performs etching in a side A etched film layer 620 on one side of the single two-sided stack substrate 610 being held stationary of one embodiment.

Simultaneously the side B focused ion beams 345 are etching a side B etched film layer 625 on the other side of the single two-sided stack substrate 610 being held in the stationary stack holding device 600. The side A grid assembly axle 320 is concentrically aligned with both the side B grid assembly axle 325 of FIG. 3 and the single two-sided stack substrate 610 being held in the stationary stack holding device 600. The simultaneous milling processes are controlled independently to control for example the depth of the etching of the film layers on both sides of the stack. The method of stack patterning using rotating ion beam grids may include the independent introduction of one or more gaseous elements or compounds into the ion beam streams. The introduction of one or more gaseous elements or compounds into the ion beam streams may include the use as a reactive agent on each side of a two-sided stack simultaneously during the ion beam milling processes.

The direction of the side A rotation 330 may be the same as the side B rotation 335 of FIG. 3 or may be opposite. This has no effect on the processing being performed by the rotating grid ion beam etching tools of one embodiment. The capability of the identical rotating grid assemblies collimation using a common concentric axis to emit ion beams to predetermined axial positions onto the surface of a stationary concentrically held stack substrate produces axial uniformity in the results of for example milling processes of one embodiment.

Figure 7:
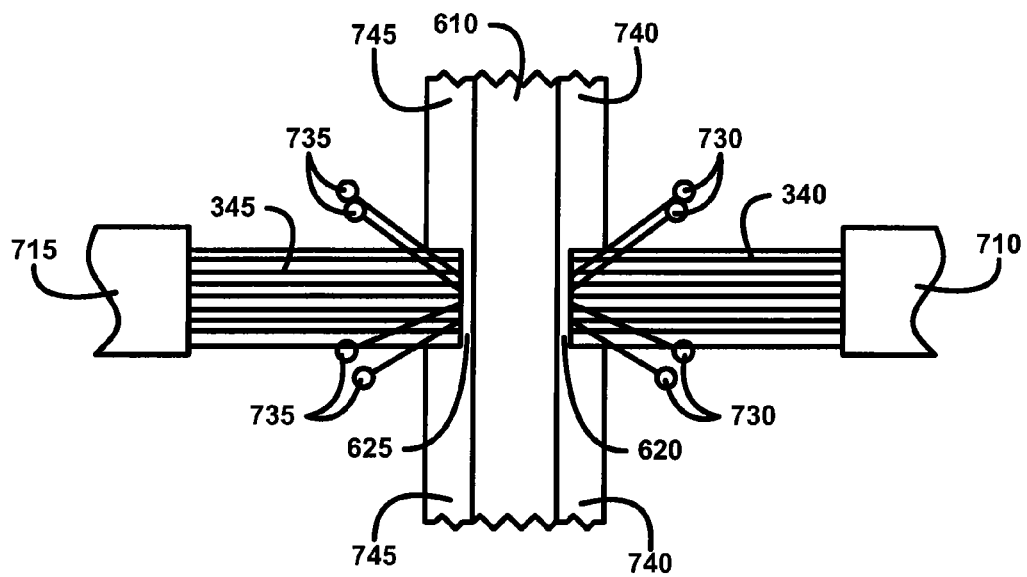
FIG. 7 shows for illustrative purposes only an example of multiple rotating grid assemblies milling process axial uniformity of one embodiment.

Milling Process Axial Uniformity:

FIG. 7 shows for illustrative purposes only an example of multiple rotating grid assemblies milling process axial uniformity of one embodiment. Axial uniformity is achievable using the method of rotating grid assemblies in ion beam etch modules used for patterned media fabrication. FIG. 7 shows an example of the axial uniformity achieved in an ion beam etching tool two-sided milling process using multiple rotating grids. The single two-sided stack substrate 610 is held stationary during a milling process of one embodiment.

A side A rotating grid beam collimator 710 directs a side A collimated focused ion beams 340 to a predetermined axial position on the substrate held stationary. The side A collimated focused ion beams 340 etches a side A film layer 740. The milling process produces side A sputtered atoms 730 from the side A film layer 740 materials being etched. The depth of the side A etched film layer 620 is controlled independently including adjusting the rate of ion plasma generation and side A collimated ion beam 340 exposure time on the predetermined axial position of the side A film layer 740 of one embodiment.

Simultaneously a side B rotating grid beam collimator 715 directs the side B collimated ion beam 345 to a complimentary axial position on a side B film layer 745. The milling process produces side B sputtered atoms 735 to be ejected from the side B film layer 745 materials being etched. The milling process using the side B collimated ion beam 345 from the side B rotating grid beam collimator 715 produces the side B etched film layer 625. The depths of the milling of the side B etched film layer 625 and side A etched film layer 620 are matched using controls that independently regulate the rate of the ion plasma generation and duration of the film layer exposure to the collimated focused ion beams. The alignment of the stationary held stack substrate and the rotating grid assembly are configured to achieve concentricity of the axes of rotation to assure axial uniformity of one embodiment.

The foregoing has described the principles, embodiments and modes of operation of the present invention. However, the invention should not be construed as being limited to the particular embodiments discussed. The above described embodiments should be regarded as illustrative rather than restrictive, and it should be appreciated that variations may be made in those embodiments by workers skilled in the art without departing from the scope of the present invention as defined by the following claims.

What is claimed is:

1. A method, comprising:
holding a single two-sided stack stationary in a stack stage;
rotating at least two grid assemblies while simultaneously ion beam etching both sides of the stack in a mirrored fashion,
wherein the grid assemblies are configured to collimate ions extracted from a plasma source into ion beams for the ion beam etching, and
wherein the grid assemblies are concentrically aligned with the stack stage on a common axis; and
controlling the grid assemblies to simultaneously achieve uniform milling depths on both sides of the stack.

2. The method of claim 1,
wherein the grid assemblies are configured to direct the ion beams parallel to the common axis with minimal divergence.

3. The method of claim 1,
wherein the plasma source comprises at least two plasma generators respectively corresponding to the at least two grid assemblies to independently supply plasma ions.

4. The method of claim 1, further comprising
using a loading device to load the stack into the stack stage for processing.

5. The method of claim 1, further comprising
using an unloading device to unload the stack from the stack stage after processing.

6. The method of claim 1, further comprising
simultaneously introducing one or more gaseous elements or compounds as reactive agents into the grid assemblies.

7. A method, comprising:
holding a single two-sided stack in a stationary position concentrically aligned with at least two grid assemblies on a common axis, wherein the grid assemblies are configured to extract ions from a plasma source into ion beams parallel to the common axis with minimal divergence; and independently rotating the grid assemblies to simultaneously ion beam etch the stack to achieve uniformity in milling depths on both sides of the stack, wherein independently rotating comprises independently rotating with respect to direction of rotation or rotational speed.

8. The method of claim 7,
wherein the direction of rotation for each grid assembly is independent of another.

9. The method of claim 7,
wherein the rotational speed for each grid assembly is independent of another.

10. The method of claim 7,
wherein the plasma source comprises an independent plasma source for each of the grid assemblies.

11. The method of claim 7, further comprising
independently introducing one or more gaseous elements or compounds as reactive agents into the grid assemblies.

12. The method of claim 7, further comprising
using a system to load the stack into a concentric stationary stack stage for processing, and using a system to unload the stack from the stack stage after processing.

13. The method of claim 7, further comprising
using an independent control system for rotating the grid assemblies to control milling depth.

14. A method, comprising:
independently rotating each of at least two grid assemblies concentrically aligned with a stationary two-sided stack on a common axis, wherein the grid assemblies are configured to extract ions from a plasma source into ion beams parallel to the common axis with minimal divergence, and wherein independently rotating comprises independently rotating with respect to direction of rotation or rotational speed; and simultaneously ion beam etching both sides of the stack with the grid assemblies.

15. The method of claim 14, further comprising
holding the stack stationary in a stack stage without rotation.

16. The method of claims 14,
wherein holding the stack stationary reduces chaff compared to that of a rotating stack stage.

17. The method of claim 14,
wherein independently rotating each of the at least two grid assemblies comprises independently rotating the grid assemblies in different directions.

18. The method of claim 14,
wherein independently rotating each of the at least two grid assemblies comprises independently rotating the grid assemblies at different speeds.

19. The method of claim 14,
wherein simultaneously etching both sides of the stack comprises achieving uniform milling depths on both sides of the stack.

20. The method of claim 19,
wherein simultaneously etching both sides of the stack comprises achieving mirrored milling results on each side of the stack.

21. The method of claim 14, further comprising
independently introducing one or more gaseous elements or compounds as reactive agents into the grid assemblies.

* * * * *

UNITED STATES PATENT AND TRADEMARK OFFICE
CERTIFICATE OF CORRECTION

PATENT NO.        : 9,330,885 B2
APPLICATION NO.   : 13/174132
DATED             : May 3, 2016
INVENTOR(S)       : Michael R. Feldbaum et al.

It is certified that error appears in the above-identified patent and that said Letters Patent is hereby corrected as shown below:

In the Claims

In Column 10, line 12, delete "14" and insert --15--, therefore.

Signed and Sealed this
Ninth Day of August, 2016

Michelle K. Lee
*Director of the United States Patent and Trademark Office*